United States Patent
Perner et al.

(10) Patent No.: US 6,667,901 B1
(45) Date of Patent: Dec. 23, 2003

(54) DUAL-JUNCTION MAGNETIC MEMORY DEVICE AND READ METHOD

(75) Inventors: Frederick A. Perner, Palo Alto, CA (US); Manish Sharma, Sunnyvale, CA (US); Manoj Bhattacharyya, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/426,381

(22) Filed: Apr. 29, 2003

(51) Int. Cl.[7] .............................................. G11C 11/15
(52) U.S. Cl. ...................... 365/173; 365/171; 365/158; 365/190; 365/189.07
(58) Field of Search ................................ 365/173, 171, 365/131, 158, 190, 189.07

(56) References Cited

U.S. PATENT DOCUMENTS

| 6,169,686 | B1 | * | 1/2001 | Brug et al. ................. 365/171 |
| 6,169,689 | B1 | * | 1/2001 | Naji ........................... 365/173 |
| 6,211,559 | B1 | * | 4/2001 | Zhu et al. .................... 257/421 |
| 6,259,644 | B1 | * | 7/2001 | Tran et al. ................... 365/209 |
| 6,262,625 | B1 | * | 7/2001 | Perner et al. .................. 330/2 |
| 6,593,608 | B1 | * | 7/2003 | Sharma et al. ............... 257/295 |

OTHER PUBLICATIONS

Abstract of JP 2002334971 (Takeshi et al., Application No. 2001139382 filed 20010509, published 20021122).

"Toshiba's double–tunnel junction boosts MRAM" Electron Engineering Times, Sep. 23, 2002, p. 18.

* cited by examiner

Primary Examiner—Andrew Q. Tran

(57) ABSTRACT

A magnetic memory device includes a first magnetic tunnel junction having a first reference ferromagnetic layer; a second magnetic tunnel junction having a second reference ferromagnetic layer; and an electrically conductive spacer layer between the first and second reference layers. The first and second reference layers are antiferromagnetically coupled.

26 Claims, 5 Drawing Sheets

DUAL-JUNCTION MAGNETIC MEMORY DEVICE AND READ METHOD

BACKGROUND

Magnetic Random Access Memory ("MRAM") is a non-volatile memory that is being considered for short-term and long-term data storage. MRAM has lower power consumption than short-term memory such as DRAM, SRAM and Flash memory. MRAM can perform read and write operations much faster (by orders of magnitude) than conventional long-term storage devices such as hard drives. In addition, MRAM is more compact and consumes less power than typical hard drives.

An MRAM device may include an array of memory cells, in which each memory cell includes a magnetic tunnel junction. A first logic value maybe written to a selected memory cell by setting its magnetic tunnel junction to a parallel magnetization orientation, or a second logic value may be written to the selected memory cell by setting its magnetic tunnel junction to an anti-parallel magnetization orientation.

The magnetization orientation affects the resistance of the magnetic tunnel junction. Generally, a magnetic tunnel junction has a nominal resistance ($R_N$) when its magnetization orientation is parallel, and a higher resistance ($R_N + \Delta R_N$) when its magnetization orientation is anti-parallel. The ratio $\Delta R_N / R_N$ is referred to as the tunneling magnetoresistance ratio (TMR) of the magnetic tunnel junction.

The logic value stored in a memory cell may be read by sensing the resistance state of the magnetic tunnel junction. However, the TMR of a typical magnetic tunnel junction tends to be relatively low. The low TMR can make it difficult to distinguish between the two resistances. Thus the low TMR reduces the reliability of reading the stored logic value.

It would be desirable to increase the reliability of reading memory cells based on magnetic tunnel junctions.

SUMMARY

According to one aspect of the present invention, a magnetic memory device includes a first magnetic tunnel junction including a first reference ferromagnetic layer; a second magnetic tunnel junction including a second reference ferromagnetic layer; and an electrically conductive spacer layer between the first and second reference layers. The first and second reference layers are antiferromagnetically coupled. Other aspects and advantages of the present invention will become apparent from the following detailed description, taken in conjunction with the accompanying drawings, illustrating by way of example the principles of the present invention.

DETAILED DESCRIPTION

Figure 1A:
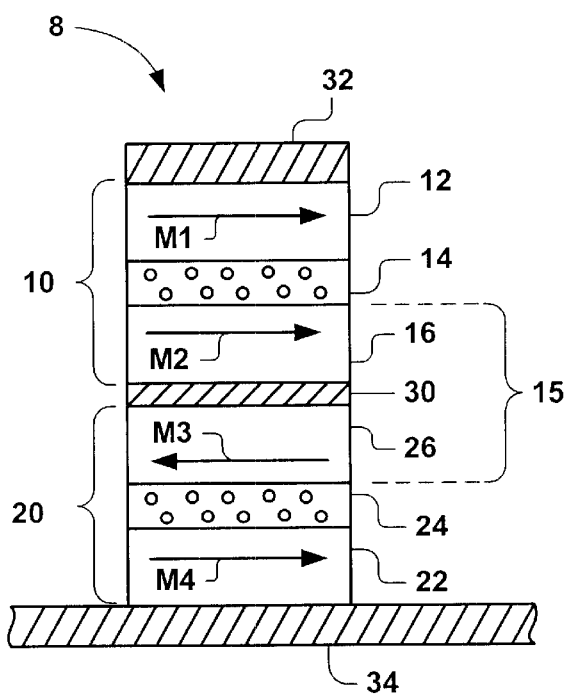
FIGS. 1a–1d are illustrations of a magnetic memory device according to an embodiment of the present invention.

Reference is made to FIGS. 1a–1d. A magnetic memory device 8 includes first and second magnetic tunnel junctions 10 and 20 that are separated by a spacer layer 30. The magnetic first tunnel junction 10 includes a first data ferromagnetic (FM) layer 12, a first insulating tunnel barrier 14, and a first reference FM layer 16. The second magnetic tunnel junction 20 includes a second data ferromagnetic (FM) layer 22, a second insulating tunnel barrier 24, and a second reference FM layer 26.

Figure 1B:
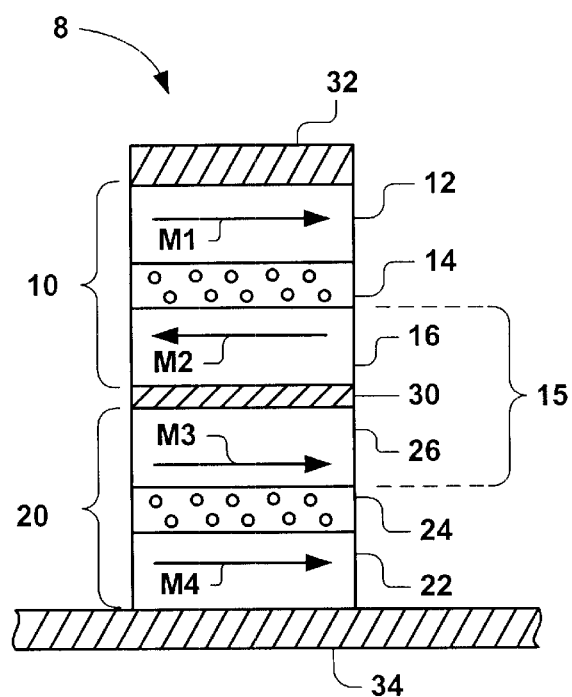
Figure 1C:
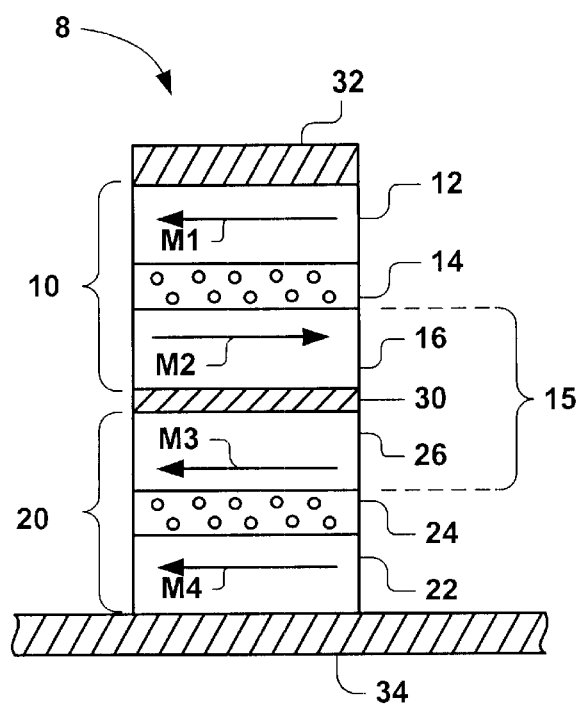
Figure 1D:
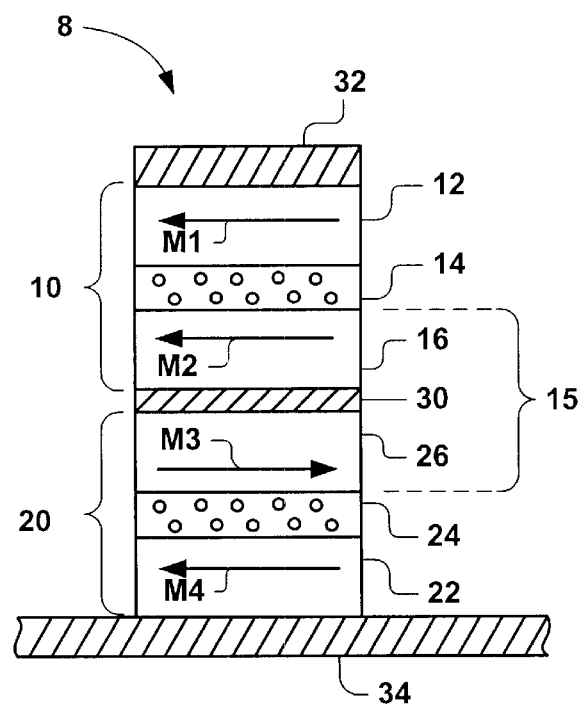

The first data layer 12 has a magnetization vector (M1) that can be oriented at either of two stable orientations (an exemplary first stable orientation is shown in FIGS. 1a–1b, and an exemplary second stable orientation is shown in FIGS. 1c–1d). The first reference layer 16 has a magnetization vector (M2) that can be oriented in either of two stable orientations (an exemplary first stable orientation is shown in FIGS. 1a and 1c, and an exemplary second stable orientation is shown in FIGS. 1b and 1d). The first insulating tunnel barrier 14 allows quantum mechanical tunneling to occur between the first data and reference layers 12 and 16.

Figure 2A:
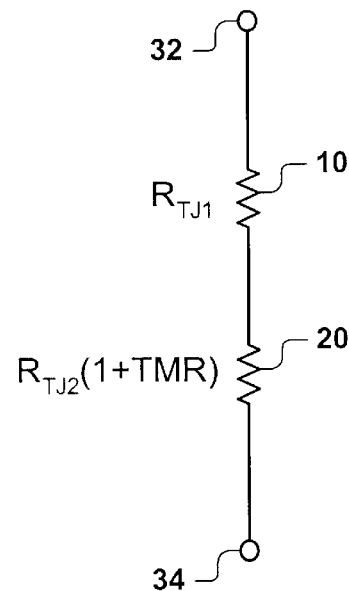
FIGS. 2a–2d are illustrations of corresponding electrical equivalents of the magnetic memory device.
Figure 2B:
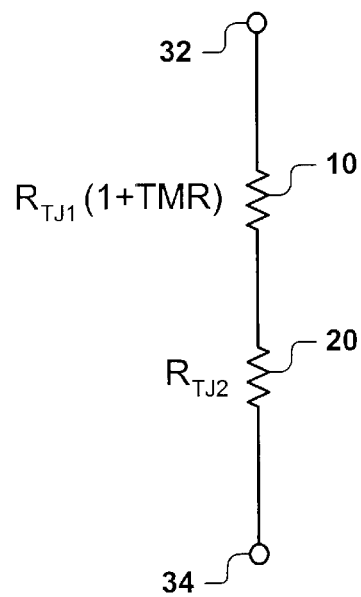
Figure 2C:
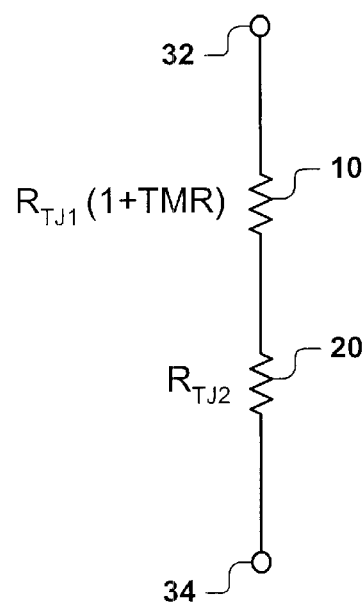
Figure 2D:
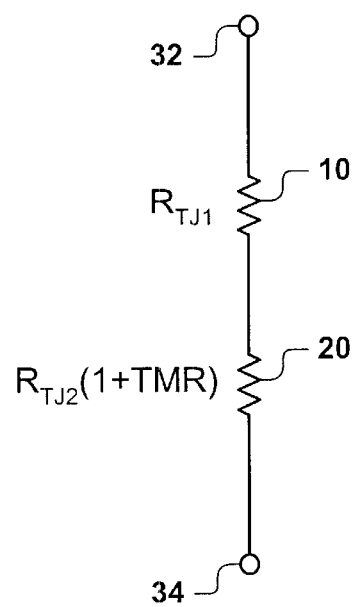

The resistance of the first magnetic tunnel junction 10 is a function of the relative orientations of the magnetization vectors (M1 and M2) of the first data and reference layers 12 and 16. The first magnetic tunnel junction 10 has a nominal resistance of $R_{TJ1}$ when its magnetization orientation is parallel, and a higher resistance of $R_{TJ1}(1+TMR_{TJ1})$ when the magnetization orientation is antiparallel. $TMR_{TJ1}$ denotes the tunneling magnetoresistance ratio of the first magnetic tunnel junction 10. FIGS. 1a and 1d illustrate parallel magnetization orientations for the first magnetic tunnel junction 10, and FIGS. 2a and 2d illustrate the corresponding resistances of the first magnetic tunnel junction 10. FIGS. 1b and 1c illustrate antiparallel magnetization orientations for the first magnetic tunnel junction 10, and FIGS. 2b and 2c illustrate the corresponding resistances of the first magnetic tunnel junction 10.

Similarly, the second data layer 22 has a magnetization vector (M4) that can be oriented in either of two stable orientations, and the second reference layer 26 has a magnetization vector (M3) that can be oriented at either of two stable orientations. The second insulating tunnel barrier 24 allows quantum mechanical tunneling to occur between the second data and reference layers 22 and 26.

The resistance of the second magnetic tunnel junction 20 is a function of the relative orientations of the magnetization vectors (M4 and M3) of the second data and reference layers 22 and 26. The second magnetic tunnel junction 20 has a nominal resistance of $R_{RTJ2}$ when its magnetization orientation is parallel, and a higher resistance of $R_{RTJ2}(1+TMR_{TJ2})$ when the magnetization orientation is anti-parallel. $TMR_{RTJ2}$ denotes the tunneling magnetoresistance ratio of the second magnetic tunnel junction 20. FIGS. 1b and 1c illustrate parallel orientations for the second magnetic tunnel junction 20, and FIGS. 2b and 2c illustrate the corresponding resistances of the second magnetic tunnel junction 20. FIGS. 1a and 1d illustrate anti-parallel magnetization orientations for the second magnetic tunnel junction 20, and FIGS. 2a and 2d illustrate the corresponding resistances of the second magnetic tunnel junction 20.

For reasons that will become apparent, the nominal resistance ($R_{RTJ2}$) of the second magnetic tunnel junction 20 is K times the nominal resistance ($R_{TJ1}$) of the first magnetic tunnel junction 10, where K is a non-unity proportionality constant. That is, $R_{RTJ2}$=K $R_{TJ1}$, and K≠1. The tunneling magnetoresistance ratio of the two magnetic tunnel junctions 10 and 20 may be about the same. Thus $TMR_{TJ2} \approx TMR_{TJ2} \approx TMR$. Values for the proportionality constant will be discussed below.

The spacer layer 30 may be made of an electrically conductive, magnetically non-conductive material such as Ru, Re, Rh or Cu. The material and thickness for the spacer layer 30 are chosen such that strong antiferromagnetic exchange coupling occurs between the first and second reference FM layers 16 and 26. The combination of the first and second reference layers 16 and 26 and the spacer layer 30 therebetween form an artificial antiferromagnet (AAF) 15 or synthetic ferrimagnet (SF) 15.

Because the reference layer magnetization vectors (M2 and M3) point in opposite directions, the magnetic moment of the AAF 15 is $MM_{AAF}$=$MM_2$−$MM_3$, where $MM_2$ is the magnetic moment of the first reference layer 16, $MM_3$ is the magnetic moment of the second reference layer 26, and $MM_{AAF}$ is the resultant magnetic moment of the AAF 15. The magnetic moments $MM_2$ and $MM_3$ may be close in magnitude, such that the resultant magnetic moment $MM_{AAF}$ is not zero but substantially lower than the magnetic moment of either data layer 12 or 22. The magnetic moments ($MM_2$ and $MM_3$) of the reference layers 16 and 26 may be made different by using different bit shapes, geometry, composition, thickness, etc.

The AAF 15 is not pinned or fixed. Thus the substantially lower resultant magnetic moment $MM_{AAF}$ allows the magnetization orientation of the AAF 15 to be switched between its stable orientations without changing the orientations of the data layer magnetization vectors (M1 and M4). One of the stable orientations is illustrated in FIGS. 1a and 1c, and the other of the stable orientations is illustrated in FIGS. 1b and 1d.

Consider the example of an AAF 15 having $MM_2$>$MM_3$. When a magnetic field is applied to the AAF 15, the vector M2 will point in the direction of the applied field and the vector M3 will point in the opposite direction. Now consider the example of an MF 15 having $MM_3$>$MM_2$. When a magnetic field is applied to the AAF 15, the vector M3 will point in the direction of the applied field and the vector M2 will point in the opposite direction.

As illustrated in FIGS. 2a–2d, the first and second magnetic tunnel junctions are electrically connected in series. Thus the resistance of the magnetic memory device 8 is the sum of the resistances of the first and second magnetic tunnel junctions 10 and 20.

A first conductor 32 makes electrical contact with the first data layer 12 of the first magnetic tunnel junction 10, and a second conductor 34 makes electrical contact with the second data layer 22 of the second magnetic tunnel junction 20. The first and second conductors 32 and 34 may be orthogonal. These conductors 32 and 34 may be used to apply switching fields to the data layers 12 and 22 during write operations, and switching fields to the AAF 15 during read operations.

During a write operation on the magnetic memory device 8, write currents are supplied to the first and second conductors 32 and 34. These write currents create magnetic fields about the first and second conductors 32 and 34. The combined magnetic field exceeds the coercivities of the data layers 12 and 22, and causes the magnetization vectors (M1 and M4) of the data layers 12 and 22 to be set in a desired orientation. (The orientation will depend upon the directions of the currents supplied to the first and second conductors 32 and 34). The orientation corresponds to a logic '1' or a logic '0'. For example, the data layer magnetization orientations of FIGS. 1a–1b could correspond to a logic '1' and the data layer magnetization orientations of FIGS. 1c–d could correspond to a logic '0'. When the write currents are removed from the first and second conductors 32 and 34, the magnetization vectors (M1 and M4) of the data layers 12 and 22 retain their orientation.

Since the data layers 12 and 22 are exposed to the same combined magnetic field, their magnetization vectors (M1 and M4) have the same orientation. However, their corresponding reference layers 16 and 26 necessarily have opposite orientations. Therefore, one of the magnetic tunnel junctions 10 or 20 has a parallel magnetization orientation, while the other has an anti-parallel magnetization orientation. Resulting is a bit-bitbar configuration.

The combined magnetic field also causes the AAF 15 to assume a specific orientation. This orientation will be influenced by the reference layer 16 or 26 having the larger magnetic moment. The orientation of the AAF 15 is unimportant during write operations.

During fabrication, the memory device 8 may be annealed in the presence of an external magnetic field. The external magnetic field sets the magnetization vectors to a known direction.

Figure 3:
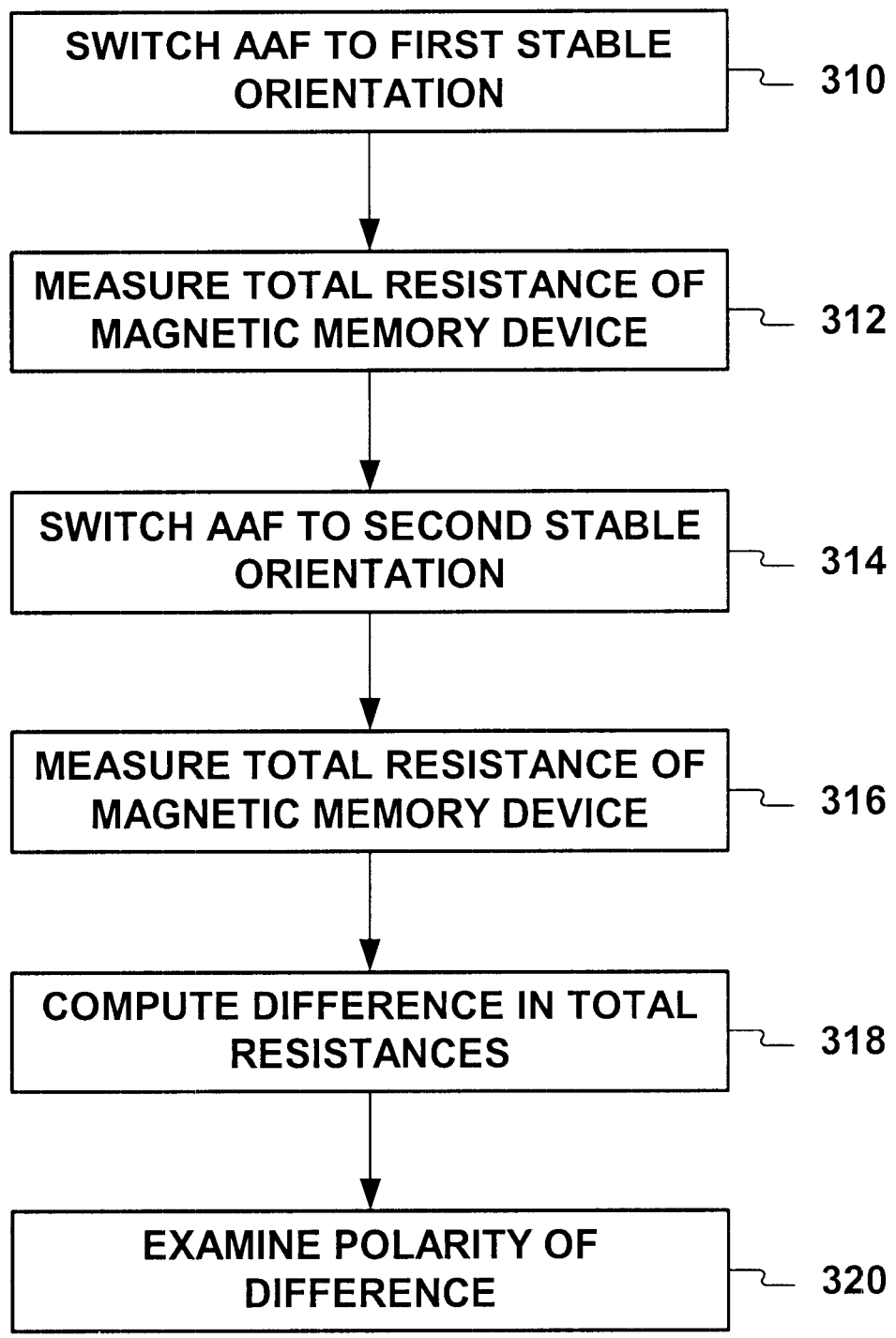
FIG. 3 is an illustration of a method of reading the magnetic memory device of FIGS. 1a–1d.

Reference is now made to FIG. 3, which illustrates a non-destructive, self-referencing, two-sample read operation on the magnetic memory device 8. The AAF 15 is switched to its first stable orientation (310). The AAF 15 may be switched by supplying read currents to the first and second conductors 32 and 34. The read currents create magnetic fields that, when combined, cause the AAF 15 to switch. The AAF 15 has a low coercivity that allows it to retain its magnetization after the switching field has been removed. Instead of using the conductors 32 and 34, an external switching field may be applied to the magnetic memory device 18. The switching field does not affect the magnetization orientation of the data layers 12 and 22.

The total resistance ($R_{TOT1}$) of the magnetic memory device 8 is measured (312). For example, a voltage may be applied across the conductors 32 and 34 (312). The voltage causes a sense current to flow through the magnetic tunnel junctions 10 and 20. The sense current is inversely proportional to the total resistance ($R_{TOT1}$).

After the total resistance has been measured, the AAF 15 is switched to its second stable orientation (314), and the total resistance ($R_{TOT2}$) of the magnetic memory device 8 is measured (316).

The difference of the resistances ($R_{TOT1}$−$R_{TOT2}$) is computed (318), and the polarity of the difference is examined (320). The polarity of the difference indicates the logic value stored in the device 8.

To see why the polarity indicates the logic value, consider the data layer magnetization orientations shown in FIGS. 1a and 1d. Since $R_{RTJ2}$=K $R_{TJ1}$ and $TMR_{TJ2} \approx TMR_{TJ2} \approx TMR$, $R_{TOT1}$=$R_{TJ1}$+$R_{TJ2}$(1+$TMR$)=$R_{TJ1}$(1+K+K·$TMR$); and $R_{TOT2}$=$R_{TJ1}$(1+$TMR$)+$R_{TJ2}$=$R_{TJ1}$(1+$TMR$+K); and ($R_{TOT1}$−$R_{TOT2}$)=$R_{TJ1}$(1+K+K·$TMR$−1−$TMR$−K).

Thus, ($R_{TOT1}$−$R_{TOT2}$)=$R_{TJ1}$(K·$TMR$−$TMR$). If K>1, then a positive polarity indicates the data layer magnetization orientation and, therefore, logic value shown in FIGS. 1a and 1b.

Now consider the data layer magnetization orientations shown in FIGS. 1b and 1c.

$$R_{TOT1} = R_{TJ1}(1+TMR) + R_{TJ2} = R_{TJ1}(1+TMR+K); \text{ and}$$

$$R_{TOT2} = R_{TJ1} + R_{TJ2}(1+TMR) = R_{TJ1}(1+K+K \cdot TMR); \text{ and}$$

$$(R_{TOT1} - R_{TOT2}) = R_{TJ1}(1+TMR+K-1-K-K \cdot TMR) = R_{TJ1}(TMR-K \cdot TMR).$$

Thus if K>1, a negative polarity will indicate the data layer magnetization orientation and, therefore, logic value shown FIGS. 1c and 1d.

If the order of switching the AAF 15 is reversed and K>1, a negative polarity will indicate the logic value shown FIGS. 1a and 1b, and a positive polarity will indicate the logic value shown FIGS. 1c and 1d.

The value for the proportionality constant K should be sufficient to allow a read circuit to distinguish between the two resistances $R_{TOT1}$ and $R_{TOT2}$. The value depends in part upon signal level (voltage/current change) and noise level during resistance measurements.

The actual value for K is also process-dependent. The resistance of a magnetic tunnel junction may be varied by varying the thickness of the insulating tunnel barrier. The nominal resistance of each magnetic tunnel junction 10 and 20 and, therefore, the actual value of K, will depend in part upon the ability to control the thickness of the barrier. Resistance of the magnetic tunnel junction is highly sensitive to the thickness of the insulating tunnel barrier. A small (e.g., less than 10%) increase in the thickness of the barrier can create a significant increase in the resistance of a magnetic tunnel junction. It has been found, for example that for a 1–2 nm tunnel barrier, an increase in barrier thickness of 0.1 nm can cause the resistance of the magnetic tunnel junction to double. An inherent variation in junction resistance (+/−1% or so) can occur due to deposition and processing variation. Therefore, to make resistances of the first and second magnetic tunnel junctions distinguishable, the nominal resistances of the first and second magnetic tunnel junctions should differ by at least the inherent variation. Thus the inherent variation sets a lower bound on the value for K.

As a first example, the nominal resistance ($R_{TJ1}$) of the first magnetic tunnel junction 10 is one megaohms, the nominal resistance ($R_{RTJ2}$) of the second magnetic tunnel junction 20 is two megaohms (whereby K=2), and the tunneling magnetoresistance ratio for both magnetic tunnel junctions 10 and 20 is TMR=15%. The read circuit should be accurate to within 150 Kohms for the magnetization orientations shown in FIGS. 1a and 1d, and within −150 Kohms for the magnetization orientations shown in FIGS. 1b and 1c.

As a second example, the nominal resistance ($R_{TJ1}$) of the first magnetic tunnel junction 10 is one megaohms, the nominal resistance ($R_{TJ2}$) of the second magnetic tunnel junction 20 is 1.5 megaohms (whereby K=1.5), and the tunneling magnetoresistance ratio for both magnetic tunnel junctions 10 and 20 is TMR=15%. The read circuit must be accurate to within 75 Kohms for the magnetization orientations shown in FIGS. 1a and 1d, and to within −75 Kohms for the magnetization orientations shown in FIGS. 1b and 1c.

As small as possible a value of K is desirable to keep $R_{TJ1}$ close to $R_{TJ2}$. However, K should be large enough to give a reasonable sensor signal to noise ratio.

The read operation is considered a two-sample operation because only two resistance measurements are made per device 8: one at each stable AAF orientation. The read operation is considered non-destructive because the contents of the magnetic tunnel junctions 10 and 20 are not overwritten. The read operation is considered self-referencing because the resistances of the magnetic tunnel junctions 10 and 20 are not compared to an external reference.

The device 8 and read method just described offer several advantages over a conventional magnetic tunnel junction and read method. The sense signal from the device 8 is larger than the equivalent signal determined by sensing the TMR of a conventional magnetic tunnel junction. Increasing the sense signal can increase the reliability of the read operation. Taking multiple samples also tends to increase the reliability of the read operation.

Self-referencing read operations tend to be more reliable than read operations in which sensed MTJ resistances are compared to an external reference value. Due to fabrication limitations, it can be difficult to generate a reference value that lies between the nominal and higher resistances of a group of magnetic tunnel junctions.

Self-referencing, non-destructive read operations tend to be faster, more reliable, and less power-hungry than destructive read operations. Destructive read operations typically involve writing values to the magnetic tunnel junction. These writes consume power, take time, and create the potential for write errors.

Figure 4:
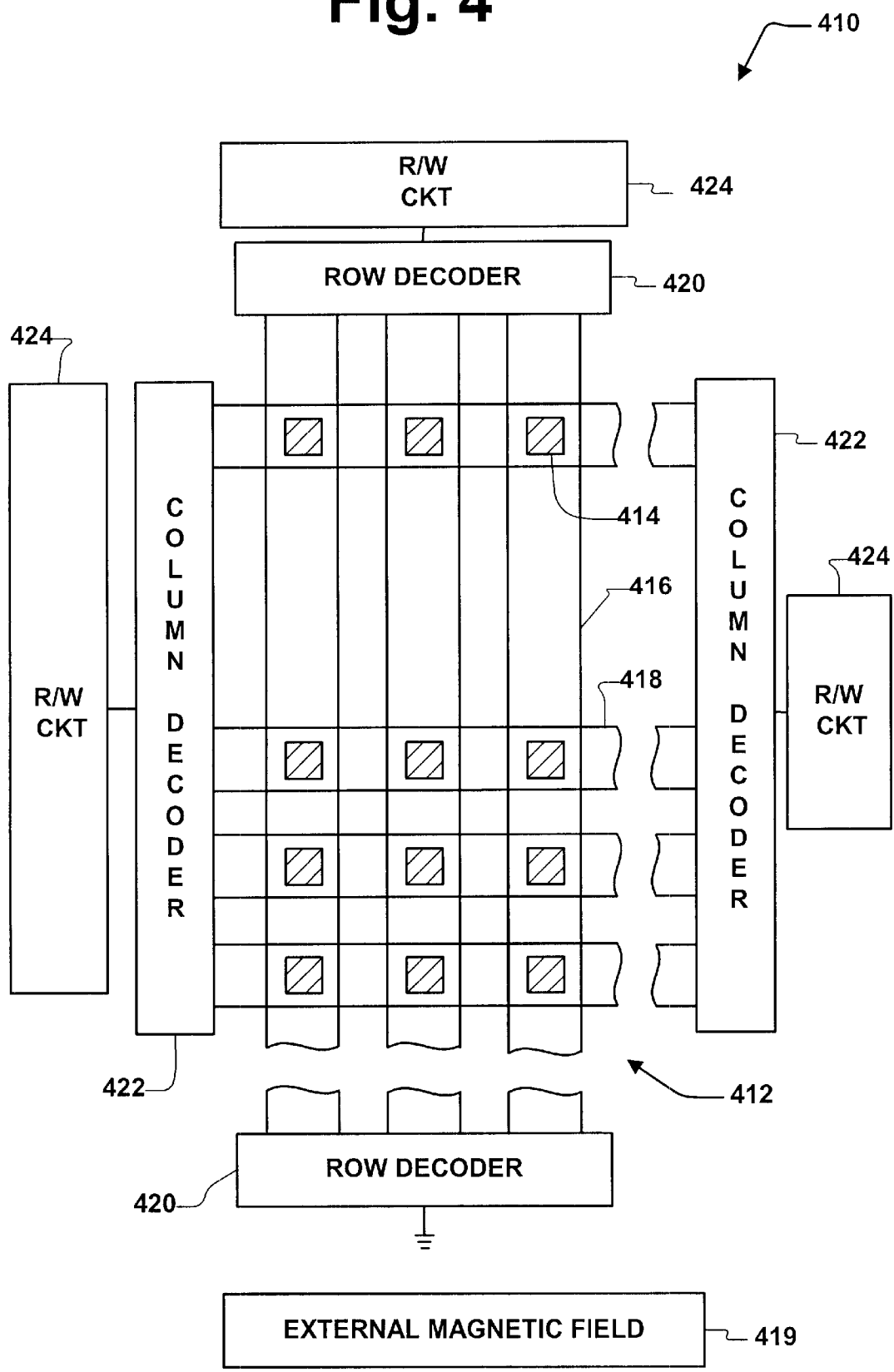
FIG. 4 is an illustration of an MRAM device according to an embodiment of the present invention.

Reference is now made to FIG. 4. An MRAM device 410 includes an array 412 of memory cells 414. Each memory cell 414 includes a magnetic memory device 8. Word lines 416 extend along rows of the array 412, and bit lines 418 extend along columns of the array 412. Each word line 416 is connected to a row of first data layers 12, and each column is connected to a column of second data layers 22. Each memory cell 414 and, therefore, each memory device 8 is at a cross point of a word line 416 and a bit line 418. Only a relatively small number of memory cells 412 is shown. In practice, arrays of other size and topology may be used.

The MRAM 410 device further includes a source 419 for applying an external magnetic field to the entire array 412 during read operations. The external magnetic field causes the AAF of each memory cell 414 to switch. The source 419 may be a coil proximate to the array 412.

The MRAM device 410 also includes row decoders 420, column decoders 422, and a read/write circuit 424. The decoders 420 and 422 select word and bit lines 416 and 418 during read and write operations. A selected memory cell 414 lies at the cross point of a selected word line 416 and selected bit line 418.

Figure 5:
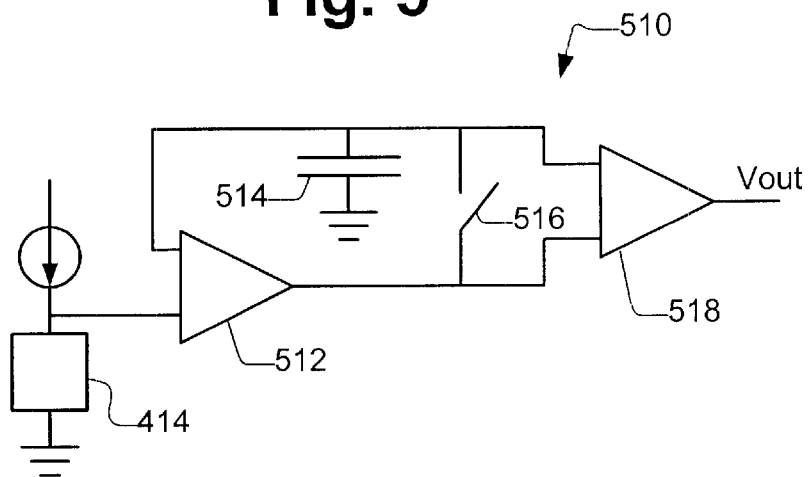
FIG. 5 is an illustration of an exemplary read circuit for the MRAM device.

The read/write circuit 424 may include for a plurality of read circuits, one read circuit for each slice of memory cells 414. An exemplary read circuit 510 is shown in FIG. 5. The exemplary read circuit 510 includes a sense amplifier 512, a sample/hold (S/H) circuit 514–516, and a comparator 518.

Figure 6:
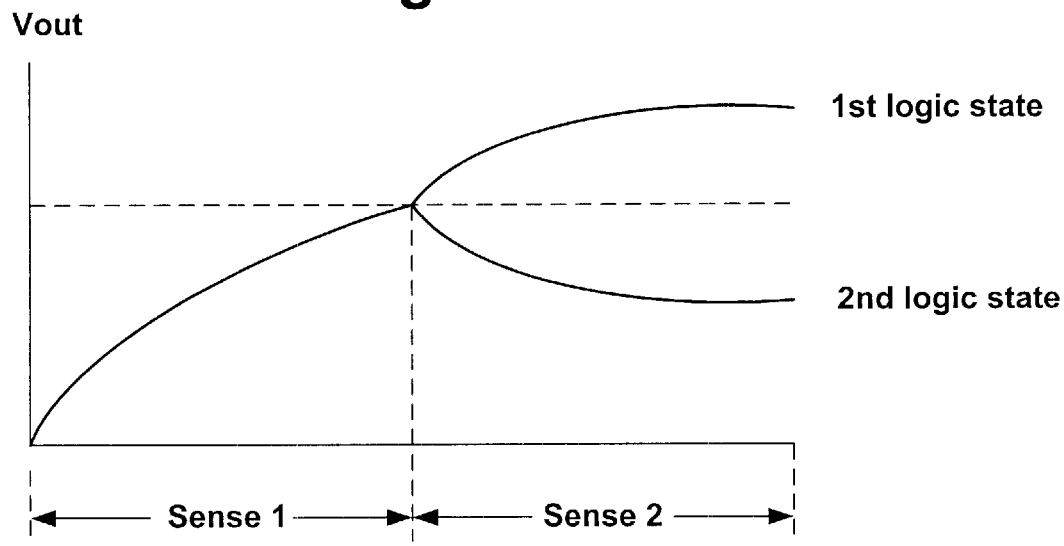
FIG. 6 illustrates the operation of the exemplary read circuit.

The sense amplifier 512 senses the resistance ($R_{TOT1}$) of a selected memory cell 414 by generating a first output voltage that is proportional to the resistance ($R_{TOT1}$). The S/H circuit 514–516 stores the first output voltage. The first output voltage is also applied to a first input of the comparator 518. As shown in FIG. 6, the output of the comparator 518 rises and then settles in response to the first output voltage.

The AAF is switched, and the sense amplifier 512 again senses the resistance ($R_{TOT2}$) of the selected memory cell 414 by generating a second output voltage that is proportional to the resistance ($R_{TOT2}$). The second output voltage is supplied to a second input of the comparator 518. As shown in FIG. 6, a first logic value corresponds to a rising output of the comparator 518, and a second logic value corresponds to a falling output of the comparator 518.

The memory cells 414 are coupled together through many parallel paths. The resistance seen at one cross point equals the resistance of the memory cells 414 at that cross point in parallel with resistances of memory cells 414 in the other rows and columns. Thus the resistance measured by sense amplifier 512 may be characterized as a cross point resistor network where parasitic or sneak path currents can interfere with the read operations. Blocking devices such as diodes or transistors may be connected to the memory cells 414 to block the parasitic currents.

In the alternative, the parasitic currents may be dealt with by using an "equipotential" method disclosed in assignee's U.S. Pat. No. 6,259,644. If configured to use the equipotential method, the read/write circuit 424 may provide the same potential to the unselected bit line 418 as the selected bit line 418, or it may provide the same potential to the unselected word line 416 as the selected word line 416.

The present invention is not limited to a source 419 for applying the switching field to the entire array 412. The word and bit lines 416 and 418 may be used instead of the source 419. For example, the read/write circuit 424 supplies read currents to the word and bit lines 416 and 418, wherein the read currents create magnetic fields that cause the AAF of a selected memory cell 414 to switch to its first stable orientation. The resistance of the selected memory cell 414 is read. Then the AAF of the selected memory cell 414 is switched to its second stable orientation, and the resistance of the selected memory cell 414 is measured again. The two measurements are compared to determine the logic value stored in the selected memory cell 414.

However, the source 419 offers advantages. The source 419 allows for faster sensing of the resistances. The resistances of a selected memory cell 414 can be measured while the switching fields are being applied to the AAF 15 of the selected memory cell 414.

The source 419 offers an additional advantage for an AAF that does not retain its magnetization orientation after the switching field is removed. The AAF 15 may have an extremely low coercivity, whereby thermal fluctuations and other influences can cause the magnetization orientation to change in the absence of an external magnetic field. The external magnetic field allows such an MF to retain its magnetization orientation while the resistances are being measured.

Figure 7:
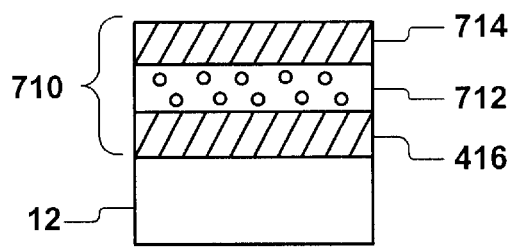
FIG. 7 is an illustration of a word line/read line structure.

The present invention is not limited to a single source 419 for applying switching fields to the entire array 412. Instead, each bit line may be replaced with the structure 710 shown in FIG. 7. The structure 710 includes a word line 416, dielectric layer 712, and read line 714. The word line 416 is in contact with the data layers of a column of memory cells 414. The read line 714 may extend in the same direction as the word line 416. The dielectric layer 712 provides electrical insulation between the word and read lines 416 and 714. During read operations, the read/write circuit 424 supplies a current to the read line 714, while the word and bit lines 416 and 418 are being used to sense the resistance of the selected memory cell 414. Thus this structure 710 also allows the resistances to be measured while the switching field is applied, except that the AAF switching field is applied to a column of memory cells 414, and not the entire array 412.

In yet another embodiment, the word and bit lines 416 and 418 could be used to apply the switching field while simultaneously sensing the resistances of selected memory cell. A current may be supplied to the selected word line 416 or bit line 418, and proper voltage references may be maintained at the sense points to determine a differential voltage while applying a common mode bias current.

The present invention is not limited to a two sample read operation. Additional samples may be taken to further improve reliability.

The present invention is not limited to an AAF 15 having three layers. An AAF could have additional layers. For instance, a five-layer MF may have a first ferromagnetic layer, a first spacer layer, a second ferromagnetic layer, a second spacer layer, and a third ferromagnetic layer. The first spacer layer would allow antiferromagnetic coupling of the first and second ferromagnetic layers, and the second spacer layer would allow ferromagnetic coupling between the second and third ferromagnetic layers to maintain the bit-bitbar configuration.

The present invention is not limited to the specific embodiments described above. Instead, the present invention is construed according to the claims that follow.

What is claimed is:

1. A magnetic memory device comprising:
    a first magnetic tunnel junction including a first reference ferromagnetic layer;
    a second magnetic tunnel junction including a second reference ferromagnetic layer;
    an electrically conductive spacer layer between the first and second reference layers;
    the first and second reference layers antiferromagnetically coupled.

2. The device of claim 1, wherein a nominal resistance of the first magnetic tunnel junction is distinguishably different than a nominal resistance of the second magnetic tunnel junction.

3. The device of claim 1, wherein a nominal resistance of the second magnetic tunnel junction is K times the nominal resistance of the first magnetic tunnel junction, where K is a non-unity proportionality constant.

4. The device of claim 1, wherein the first magnetic tunnel junction includes a first insulating tunnel barrier, and the second magnetic tunnel junction includes a second insulating tunnel barrier, the first and second insulating tunnel barriers having substantially different thickness.

5. The device of claim 4, wherein nominal resistances of the first and second magnetic tunnel junctions differ by at least a variation in processing the insulating tunnel barriers.

6. The device of claim 1, wherein the first magnetic tunnel junction further includes a first data layer, and the second magnetic tunnel junction further includes a second data layer; and wherein the reference layers and the spacer layer form an artificial antiferromagnet (AAF), a resultant magnetic moment of the AAF being substantially lower than the magnetic moment of either data layer.

7. The device of claim 6, wherein the AAF is not pinned.

8. The device of claim 6, wherein the AAF retains its magnetization orientation in the absence of an external magnetic field.

9. The device of claim 6, wherein the AAF does not retain its magnetization orientation in the absence of an external magnetic field.

10. A method of writing a logic value to the device of claim 1, the method including simultaneously applying a switching field to both magnetic tunnel junctions, the switching field causing data layer magnetization of the first and second magnetic tunnel junctions to be oriented in the same stable direction, whereby the first and second magnetic tunnel junctions have opposite magnetization orientations.

11. A method of reading the device of claim 1, the method comprising
    orienting the magnetization of the coupled reference layers in a first stable orientation, and measuring a first resistance of the device;

orienting the magnetization of the coupled reference layers in a second stable orientation, and measuring a second resistance of the device; and using the measured first and second resistances to determine a logic value stored in the device.

12. The method of claim 11, wherein the logic value is determined by examining a polarity of a difference between the resistance measurements.

13. A magnetic memory device comprising:

an artificial antiferromagnet;

first and second insulating tunnel barriers on opposite sides of the artificial antiferromagnet;

a first data ferromagnetic layer on the first insulating tunnel barrier; and a second data ferromagnetic layer on the second insulating tunnel barrier;

the first and second insulating tunnel barriers having a substantially different thickness.

14. A data storage device comprising an array of memory cells, each memory cell including first and second magnetic tunnel junctions, and a spacer layer separating first and second reference layers of the first and second magnetic tunnel junctions, the first and second reference layers(AF) coupled.

15. The data storage device of claim 14, further comprising a circuit for writing to selected memory cells during write operations, the circuit writing to a selected memory cell by simultaneously applying a switching field to both magnetic tunnel junctions of the selected memory cell, the switching field causing data layer magnetization of the both magnetic tunnel junctions to be oriented in the same stable direction, whereby the first and second magnetic tunnel junctions of the selected memory cell have opposite magnetization orientations.

16. The device of claim 14, further comprising means for applying an external switching field to a plurality of AF-coupled reference layers during a read operation.

17. The data storage device of claim 16, further comprising a circuit for reading memory cells during read and write operations, the circuit reading a selected memory cell by:

orienting the magnetization of the AF-coupled reference layers of the selected memory cell in a first stable orientation, and measuring a first resistance of the selected memory cell;

orienting the magnetization of the AF-coupled reference layers in a second stable orientation, and measuring a second resistance of the selected memory cell; and using the measured first and second resistances to determine a logic value stored in the selected memory cell.

18. The device of claim 17, wherein the switching field is applied to orient the magnetization of the AF-coupled reference layers of the selected memory cell in the first stable orientation; wherein the first resistance of the selected memory cell is measured after the AF-coupled reference layers are oriented in the first stable direction; wherein the switching field is applied to orient the magnetization of the AF-coupled reference layers in the second stable orientation after the first resistance is measured; and wherein the second resistance of the selected memory cell is measured after the AF-coupled reference layers are oriented in the second stable direction.

19. The device of claim 17, wherein the switching field is applied to the AF-coupled reference layers of the selected memory cell while the resistances are being measured.

20. The device of claim 17, wherein the logic value is determined by examining a polarity of a difference between the resistance measurements.

21. The device of claim 17, wherein the read circuit includes a sense amplifier for generating a first signal that is proportional to the resistance of the selected memory cell; a sample/hold circuit for storing a first sample of the signal; and a comparator for comparing the signal to the first sample subsequent to the first sample being taken, an output of the comparator changing in response to the comparison, the direction of the output change indicating the logic value.

22. The device of claim 14, each memory cell further including first and second insulating tunnel barriers having substantially different thickness.

23. The device of claim 14, each memory cell further including a first and second data ferromagnetic layers wherein the reference layers and the spacer layer form an unpinned AAF, a resultant magnetic moment of the artificial antiferromagnet (AAF) being substantially lower than the magnetic moment of either data layer.

24. The device of claim 23, wherein the AAF of at least one memory cell retains its magnetization orientation in the absence of an external magnetic field.

25. The device of claim 23, wherein the AAF of at least one memory cell does not retain its magnetization orientation in the absence of an external magnetic field.

26. A read circuit for an magnetic memory device, the circuit comprising:

a sense amplifier for generating a first signal that is proportional to a resistance of the memory device;

a sample/hold circuit for storing a first sample of the signal; and a comparator for comparing the signal to the first sample subsequent to the first sample being taken, an output of the comparator changing in response to the comparison, the direction of the output change indicating the logic value.

* * * * *